(12) United States Patent
Kishimoto

(10) Patent No.: US 10,778,211 B2
(45) Date of Patent: Sep. 15, 2020

(54) SWITCHING CIRCUIT AND SEMICONDUCTOR MODULE

(71) Applicant: Murata Manufacturing Co., Ltd., Kyoto (JP)

(72) Inventor: Ken Kishimoto, Kyoto (JP)

(73) Assignee: MURATA MANUFACTURING CO., LTD, Kyoto (JP)

( * ) Notice: Subject to any disclaimer, the term of this patent is extended or adjusted under 35 U.S.C. 154(b) by 23 days.

(21) Appl. No.: 14/521,563

(22) Filed: Oct. 23, 2014

(65) Prior Publication Data

US 2015/0180466 A1    Jun. 25, 2015

(30) Foreign Application Priority Data

Dec. 24, 2013 (JP) ................... 2013-265319

(51) Int. Cl.
| | |
|---|---|
| *H03K 17/16* | (2006.01) |
| *H03K 17/687* | (2006.01) |
| *H03K 17/689* | (2006.01) |
| *H03K 17/693* | (2006.01) |

(52) U.S. Cl.
CPC ......... *H03K 17/162* (2013.01); *H03K 17/689* (2013.01); *H03K 17/6871* (2013.01); *H03K 17/693* (2013.01)

(58) Field of Classification Search
CPC ............. H03K 17/162; H03K 17/6871; H03K 17/689; H03K 17/693
See application file for complete search history.

(56) References Cited

U.S. PATENT DOCUMENTS

| | | | |
|---|---|---|---|
| 5,774,792 A | 6/1998 | Tanaka et al. | |
| 5,886,394 A * | 3/1999 | Leeuwenburgh | ....... H01F 5/003 257/531 |
| 7,468,543 B2 | 12/2008 | Sagae et al. | |
| 7,719,386 B2 | 5/2010 | Atsumo et al. | |

(Continued)

FOREIGN PATENT DOCUMENTS

| | | |
|---|---|---|
| JP | 05-048365 A | 2/1993 |
| JP | 09-023101 A | 1/1997 |

(Continued)

OTHER PUBLICATIONS

Office action issued in JP2013-265319 dated Sep. 15, 2015.
Office action issued in JP2013-265319 dated Feb. 9, 2016.

*Primary Examiner* — Lincoln D Donovan
*Assistant Examiner* — Colleen J O Toole
(74) *Attorney, Agent, or Firm* — Pearne & Gordon LLP

(57) ABSTRACT

A switching circuit includes first to (N+1)th input/output terminals and first to Nth field-effect transistors (FETs), for an integer N of two or more. When one of a source end and a drain end is referred to as a first end and another one is referred to as a second end, the first input/output terminal is electrically connected to the first ends of all of the first to Nth FETs. For each integer i of one to N, the second end of the ith FET is electrically connected to the (i+1)th input/output terminal. For at least one integer j of one to N, a combination in which an inductor component and a resistor component are electrically connected in series to each other is disposed between the first and second ends of the jth FET such that the combination is electrically connected in parallel to the jth FET.

18 Claims, 19 Drawing Sheets

(56) References Cited

U.S. PATENT DOCUMENTS

| | | | |
|---|---|---|---|
| 8,960,558 B1 * | 2/2015 | MacKenzie | G06K 19/07749 235/492 |
| 9,143,184 B2 * | 9/2015 | Gorbachov | H04B 1/48 |
| 2003/0090313 A1 | 5/2003 | Burgener et al. | |
| 2004/0155729 A1 * | 8/2004 | Ko | H01P 11/00 333/164 |
| 2008/0100399 A1 | 5/2008 | Atsumo et al. | |
| 2012/0157029 A1 * | 6/2012 | Matsuura | H04H 20/106 455/253.2 |
| 2012/0262217 A1 | 10/2012 | Gorbachov | |

FOREIGN PATENT DOCUMENTS

| | | |
|---|---|---|
| JP | 09-107203 A | 4/1997 |
| JP | 10-200302 A | 7/1998 |
| JP | 2003-338773 A | 11/2003 |
| JP | 2005-117634 A | 4/2005 |
| JP | 2008-118233 A | 5/2008 |
| WO | 2010098255 A1 | 9/2010 |

* cited by examiner

SWITCHING CIRCUIT AND SEMICONDUCTOR MODULE

BACKGROUND OF THE INVENTION

1. Field of the Invention

The present invention relates to a switching circuit and a semiconductor module.

2. Description of the Related Art

A high-frequency switch is a switch for switching a transmission path for high-frequency signals. For example, in a wireless communication device, such as a cellular phone or a wireless local area network (LAN), a high-frequency switch is used to switch a frequency band or to switch a transmission path between that for a transmission signal and that for a reception signal.

One example of a single pole double throw (SPDT) switching circuit is disclosed in Japanese Unexamined Patent Application Publication No. 9-107203. This switching circuit aims to have high isolation at a desired frequency. This switching circuit switches a signal transmission path between a first transmission path for use in transmitting a signal from an input/output terminal to a reception terminal and a second transmission path for use in transmitting a signal from a transmission terminal to the input/output terminal. This switching circuit includes an inductor disposed between the transmission terminal and the reception terminal.

In the technique disclosed in Japanese Unexamined Patent Application Publication No. 9-107203, a parasitic capacitance in a field-effect transistor (FET) and the inductor constitute a resonant circuit. A resonant frequency of the resonant circuit is set at a frequency for use. Thus it is expected that high isolation is achieved at that frequency for use.

However, an increase in isolation of the switching circuit expands isolation deviation in a predetermined frequency band including that frequency for use. The resonant frequency varies depending on factors, such as variations in inductance value or variations in parasitic capacitance of the FET. When the isolation deviation is large, a problem may arise in that because of the variations in resonant frequency, there are large variations in isolation characteristics among a plurality of switching circuits having the same configuration.

BRIEF SUMMARY OF THE INVENTION

Accordingly, it is an object of the present invention to provide a switching circuit that is less affected by a resonant frequency and that is capable of suppressing the variations in the isolation characteristics and to provide a semiconductor module including the switching circuit.

According to preferred embodiments of the present invention, a switching circuit includes, for an integer N of two or more, first to (N+1)th input/output terminals and first to Nth field-effect transistors each including a gate end, a source end, and a drain end. When one of the source end and the drain end is referred to as a first end and another one is referred to as a second end, the first input/output terminal is electrically connected to the first ends of all of the first to Nth field-effect transistors. For each integer i of one to N, the second end of the ith field-effect transistor is electrically connected to the (i+1)th input/output terminal. For at least one integer j of one to N, a combination in which an inductor component and a resistor component are electrically connected in series to each other is disposed between the first end and the second end of the jth field-effect transistor such that the combination is electrically connected in parallel to the jth field-effect transistor.

According to the preferred embodiments of the present invention, the switching circuit less affected by the resonant frequency and capable of suppressing the variations in the isolation characteristics can be achieved.

Other features, elements, characteristics and advantages of the present invention will become more apparent from the following detailed description of preferred embodiments of the present invention with reference to the attached drawings.

DETAILED DESCRIPTION OF THE INVENTION

Figure 1:
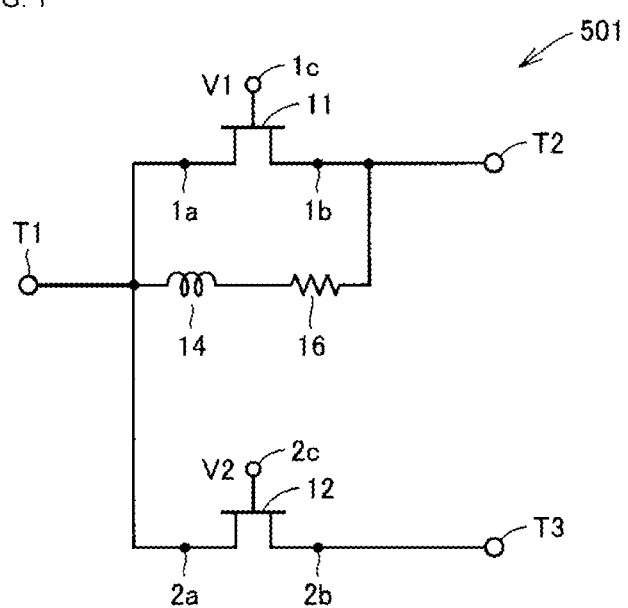
FIG. 1 is a circuit diagram that illustrates a basic configuration of a switching circuit according to a first embodiment based on the present invention.

Embodiments of the present invention are described below with reference to the drawings. In the drawings, the same or corresponding portions have the same reference numerals, and the description thereof is not repeated.

In the present specification, "electrically connected" includes both the case where two elements are directly connected to each other and the case where two elements are connected to each other through another element. Examples of the "elements" may include, but are not limited to, passive elements, active elements, terminals, and lines.

In the present specification, "input/output terminal" indicates a terminal usable as both an input terminal and an output terminal. It is to be noted, however, that being usable is not synonymous with being actually used. Accordingly, the "input/output terminal" in the present specification is not limited to the one through which signals are both input and output.

First Embodiment

Configuration

A switching circuit according to a first embodiment based on the present invention is described with reference to FIG. 1.

The switching circuit according to the present embodiment includes first to (N+1)th input/output terminals and first to Nth field-effect transistors (hereinafter referred to as "FETs") each including a gate end, a source end, and a drain end, for an integer N of two or more. When one of the source end and the drain end is referred to as a first end and another one is referred to as a second end, the first input/output terminal is electrically connected to the first ends of all of the first to Nth FETs. For each integer i of one to N, the second end of the ith FET is electrically connected to the (i+1)th input/output terminal. For at least one integer j of one to N, a combination in which an inductor component and a resistor component are electrically connected in series to each other is disposed between the first and second ends of the jth FET such that the combination is electrically connected in parallel to the jth FET.

As one example, on the assumption that N is two, a switching circuit 501 according to the present embodiment is described. As illustrated in FIG. 1, the switching circuit 501 includes first to third input/output terminals T1 to T3. The switching circuit 501 includes a first FET 11 and a second FET 12 each including a gate end, a source end, and a drain end. In the switching circuit 501, the first FET 11 includes a first end 1a and a second end 1b, and the second FET 12 includes a first end 2a and a second end 2b. Here, one of the source end and the drain end is referred to as the first end, and another one is referred to as the second end. Either one of the source end and the drain end may be referred to as the first end. The first input/output terminal T1 is electrically connected to both the first end 1a of the first FET 11 and the first end 2a of the second FET 12.

For each integer i of one and two, the second end of the ith FET is electrically connected to the (i+1)th input/output terminal. That is, the second end 1b of the first FET 11 is electrically connected to the second input/output terminal T2, and the second end 2b of the second FET 12 is electrically connected to the third input/output terminal T3.

In addition, for at least one integer j of one and two, a combination in which an inductor component and a resistor component are electrically connected in series to each other is disposed between the first and second ends of the jth FET such that the combination is electrically connected in parallel to the jth FET. That is, in the switching circuit 501, the integer j matching with "at least one integer j of one and two" is one. As illustrated in FIG. 1, a combination in which an inductor 14 as the inductor component and a resistor 16 as the resistor component are electrically connected in series to each other is disposed between the first end 1a and the second end 1b of the first FET 11 such that the combination is electrically connected in parallel to the first FET 11.

The first FET 11 further includes a gate end 1c, in addition to the first end 1a and the second end 1b. Whether the state between the first end 1a and the second end 1b in the first FET 11 is turned on or off is controlled by a control voltage V1 applied to the gate end 1c. The second FET 12 further includes a gate end 2c, in addition to the first end 2a and the second end 2b. Whether the state between the first end 2a and the second end 2b in the second FET 12 is turned on or off is controlled by a control voltage V2 applied to the gate end 2c.

A combination in which the inductor 14 and the resistor 16 are electrically connected in series to each other is disposed between the first end 1a and the second end 1b of the first FET 11 such that the combination is electrically connected in parallel to the first FET 11. In the example illustrated in FIG. 1, because the first end 1a of the first FET 11 is electrically connected to the first input/output terminal T1, it can also be said that one end of the inductor 14 is electrically connected to the first input/output terminal T1. Another end of the inductor 14 is connected to one end of the resistor 16. In the example illustrated in FIG. 1, because the second end 1b of the first FET 11 is electrically connected to the second input/output terminal T2, it can also be said that another end of the resistor 16 is electrically connected to the second input/output terminal T2.

Functions and Advantageous Effects

The switching circuit 501 illustrated in FIG. 1 can function as an SPDT switch. In this case, the first FET 11 and the second FET 12 are turned on and off in a complementary manner.

More specifically, when the first FET 11 is in an on state and the second FET 12 is in an off state, a first transmission path is established between the first input/output terminal T1 and the second input/output terminal T2. In contrast, when the first FET 11 is in an off state and the second FET 12 is in an on state, a second transmission path is established between the first input/output terminal T1 and the third input/output terminal T3.

Figure 2:
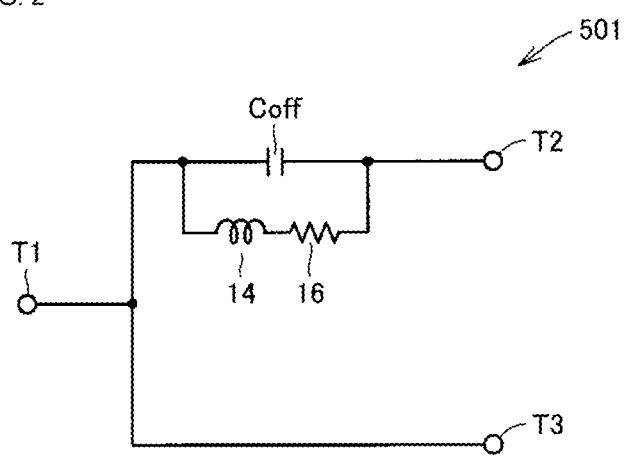
FIG. 2 is an equivalent circuit diagram in a state where a second transmission path is established in the switching circuit according to the first embodiment based on the present invention.

An equivalent circuit diagram for the switching circuit 501 when the second transmission path is established is illustrated in FIG. 2. In FIG. 2, the second transmission path is equivalently illustrated as a line that connects the first input/output terminal T1 and the third input/output terminal T3. The first transmission path is disconnected by the first FET 11, and the FET in such an off state can be considered a capacitor. Accordingly, the first FET 11 is equivalently represented as a capacitance Coff.

The inductor 14 and the capacitance Coff constitute a parallel resonant circuit. The function of the resistor 16 is described below. Isolation between the first input/output terminal T1 and the second input/output terminal T2 can be increased at a resonant frequency of the parallel resonant circuit.

This resonant frequency of that parallel resonant circuit is determined by an inductance value of the inductor 14 and a capacitance value of the capacitance Coff. Specifically, the resonant frequency is set at a desired frequency (for example, center frequency) within an operating frequency band of the switching circuit 501. Accordingly, the switching circuit 501 can achieve high isolation in the operation frequency band.

A Q value of the parallel resonant circuit constituted of the inductor 14 and the capacitance Coff can be represented as $\omega_0/(\omega_2-\omega_1)$. $\omega_0$ is the resonant frequency of the parallel resonant circuit. $\omega_1$ is a frequency at which a vibration energy is half of its peak value on a side lower than the resonant frequency $\omega_0$. $\omega_2$ is a frequency at which a vibration energy is half of its peak value on a side higher than the resonant frequency. $(\omega_2-\omega_1)$ is called "half-width."

As a target for comparison, a configuration in which the resistor 16 is removed from the parallel resonant circuit illustrated in FIG. 2 is discussed. This configuration corresponds to a switching circuit using a chip inductor in the related art. In this case, the Q value of the parallel resonant circuit can increase with an increase in inductance value of the inductor. The isolation at the resonant frequency can increase with an increase in Q value.

However, when the Q value of the parallel resonant circuit increases, the half-width decreases. Accordingly, the isolation deviation in a predetermined frequency band including that resonant frequency is large. The "isolation deviation" used here can be defined as the difference between the maximum value and the minimum value of the isolation in a certain frequency band.

The resonant frequency $\omega_0$ of the parallel resonant circuit varies depending on a factor, such as variations in inductance value of the inductor or variations in capacitance value of the capacitance Coff. Accordingly, when the isolation deviation is large, because of the variations in resonant frequency $\omega_0$, the isolation characteristics largely vary among a plurality of switching circuits having the same configuration.

In the present embodiment, the switching circuit 501 includes the resistor 16, which is connected in series to the inductor 14. With the resistor 16, the Q value of the parallel resonant circuit decreases, whereas the half-width can be widened. Thus the isolation deviation can be decreased over a wide frequency band. As a result, the switching circuit with the isolation deviation having small variations with respect to the variations in inductance value of the inductor 14 and the variations in capacitance value of the capacitance Coff can be achieved.

As described above, in the present embodiment, the switching circuit less affected by the resonant frequency and capable of suppressing the variations in the isolation characteristics can be achieved.

(Comparison of Isolation Characteristics)

Figure 3:
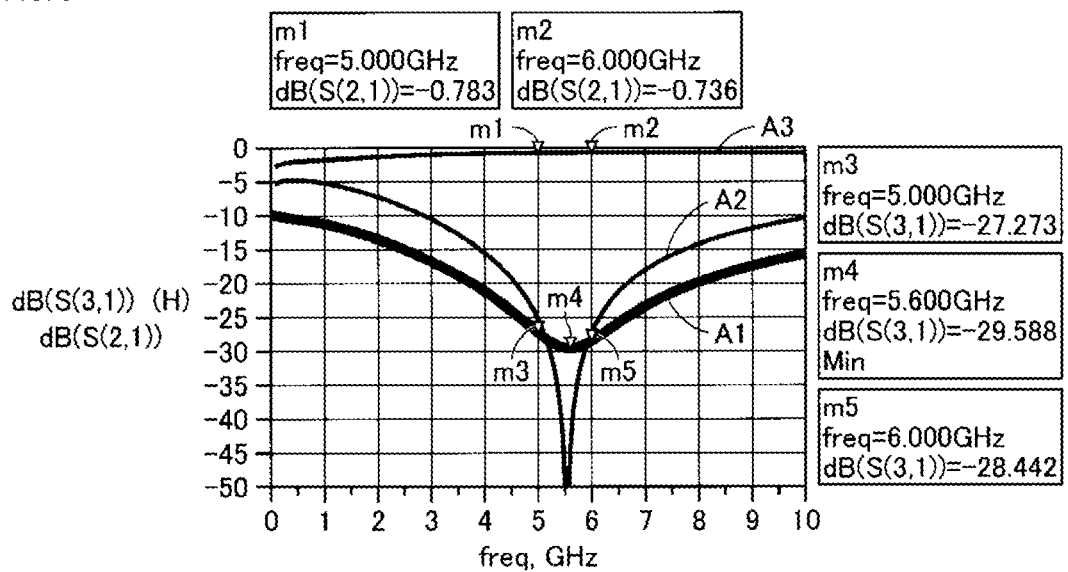
FIG. 3 is a graph that illustrates the comparison between the isolation characteristics in the switching circuit according to the first embodiment based on the present invention and the isolation characteristics in a switching circuit using a chip inductor in the related art.

FIG. 3 is a graph that illustrates the comparison between the isolation characteristics in the switching circuit 501 according to the present embodiment and the isolation characteristics in a switching circuit using a chip inductor in the related art. The comparison of the isolation characteristics is premised on a situation where the first FET 11 is in an off state and the second FET 12 is in an on state. That is, this means that the first transmission path is disconnected and the second transmission path is established. In FIG. 3, a curve A1 indicates the frequency characteristics for the isolation between the first input/output terminal T1 and the second input/output terminal T2 obtained by the switching circuit 501 according to the present embodiment. A curve A2 indicates the frequency characteristics for the isolation between the first input/output terminal T1 and the second input/output terminal T2 obtained by the switching circuit using the chip inductor in the related art. A curve A3 indicates the frequency characteristics for the insertion loss when a signal is transmitted from the first input/output terminal T1 to the third input/output terminal T3 through the second transmission path. Of the numbers 1, 2, and 3 inside the parentheses of "S(2, 1)" and "S(3, 1)" in FIG. 3, the number "1" indicates the first input/output terminal T1, the number "2" indicates the third input/output terminal T3, and the number "3" indicates the second input/output terminal T2.

The inductance value of the inductor 14 is approximately 11 nH, and the resistance value of the resistor 16 is approximately 100Ω. An example of the capacitance value of the capacitance Coff may be approximately 0.0835 pF. These numerical values are provided merely as examples and are not intended to limit the values. The frequencies illustrated in FIG. 3 are extracted merely as examples for description.

In FIG. 3, the marker denoted by "m1" indicates the insertion loss in the second transmission path at the frequency of approximately 5 GHz. The marker denoted by "m2" indicates the insertion loss in the second transmission path at the frequency of approximately 6 GHz. The marker denoted by "m3" indicates the isolation in the first transmission path at the frequency of approximately 5 GHz. The marker denoted by "m4" indicates the isolation in the first transmission path in the vicinity of the resonant frequency. The marker denoted by "m5" indicates the isolation in the first transmission path at the frequency of approximately 6 GHz.

The horizontal axis in the graph indicates the frequency, and the vertical axis in the graph indicates the isolation and insertion loss. A numerical value (negative value) on the vertical axis indicates that as its absolute value increases, the isolation increases.

When the resistor 16 is not included, that is, in the case of the switching circuit using the chip inductor in the related art, as indicated by the curve A2, the isolation is high in the vicinity of the resonant frequency (approximately 5.6 GHz). However, the isolation deviation is large within the frequency range of approximately 5 GHz to approximately 6 GHz. In contrast, in the present embodiment, as indicated by the curve A1, the isolation deviation is small within the frequency range of approximately 5 GHz to approximately 6 GHz and is on the order of approximately 2 dB. That is, according to the present embodiment, the isolation deviation over a wide frequency band can be reduced. Even in the present embodiment, as is evident from the curve A3, the insertion loss in the second transmission path within the frequency range of approximately 5 GHz to approximately 6 GHz does not substantially change.

As described above, in the present embodiment, for example, even when the inductance value of the inductor varies and thus the resonant frequency varies, it is confirmed that a switching circuit less affected by the variations and capable of suppressing the variations in the isolation characteristics can be achieved.

Second Embodiment

Configuration

Figure 4:
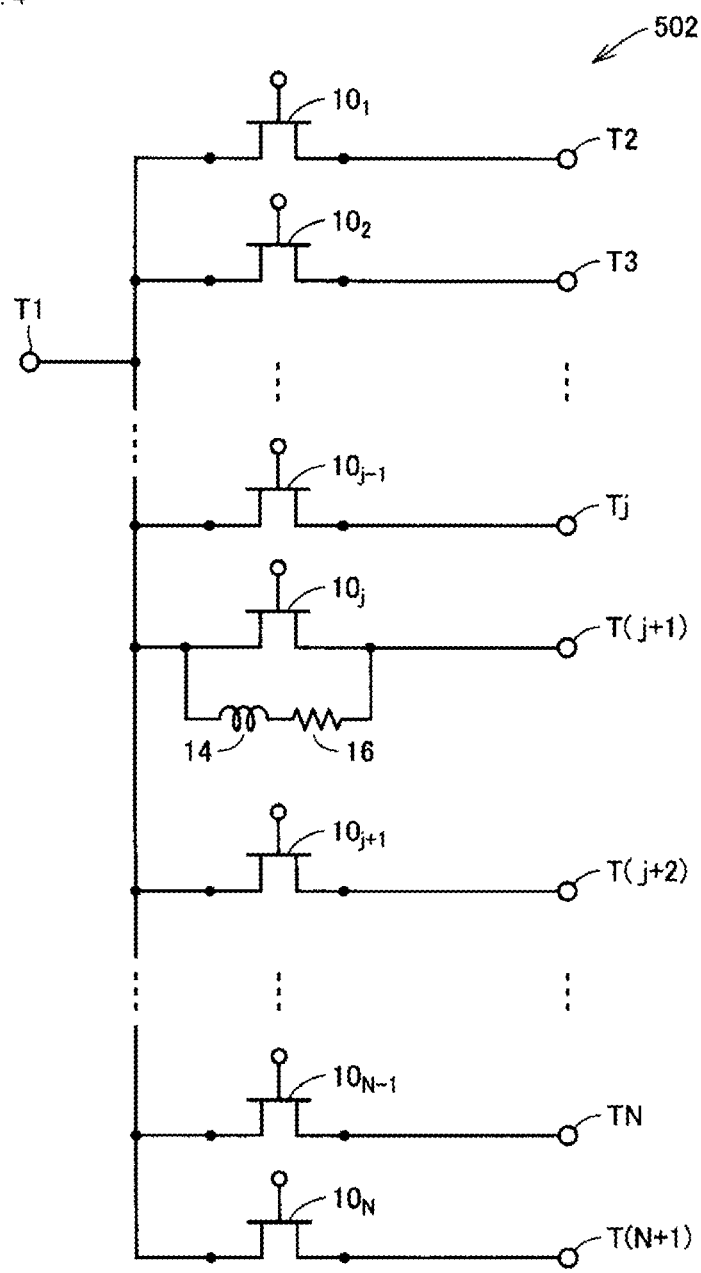
FIG. 4 is a circuit diagram that illustrates a basic configuration of a switching circuit according to a second embodiment based on the present invention.

A switching circuit according to a second embodiment based on the present invention is described with reference to FIG. 4. In the first embodiment, the example where N is two is described. In the present embodiment, as illustrated in FIG. 4, a generalized configuration is described. For the sake of description, N is indicated as a large integer in FIG. 4. However, according to the idea in the present invention, N may be any integer of more than one.

A switching circuit 502 according to the present embodiment includes first to (N+1)th input/output terminals T1, T2, T3, . . . , TN, and T(N+1) and first to Nth FETs $10_1$, $10_2$, . . . , $10_{N-1}$, and $10_N$ each including a gate end, a source end, and a drain end, for an integer N of two or more. When one of the source end and the drain end is referred to as a first end and another one is referred to as a second end, the first input/output terminal T1 is electrically connected to the first ends of all of the first to Nth FETs $10_1$, $10_2$, . . . , $10_{N-1}$, and $10_N$. For each integer i of one to N, the second end of the ith FET $10_i$ is electrically connected to the (i+1)th input/output terminal T(i+1). For at least one integer j of one to N, a combination in which the inductor 14 as an inductor component and the resistor 16 as a resistor component are electrically connected in series to each other is disposed between the first end and second end of the jth FET $10_j$ such that the combination is electrically connected in parallel to the jth FET $10_j$.

Actions and Advantages

The switching circuit 502 illustrated in FIG. 4 can function as a single pole N throw (SPNT) switch. By turning on one of the first FET $10_1$ to Nth FET $10_N$ and turning off all of the others, a transmission path can be established between the first input/output terminal T1 and a selected one of the second input/output terminal T2 to the (N+1)th input/output terminal T(N+1). In that case, an FET in an off state can be considered the capacitance Coff. Accordingly, when the jth FET $10_j$ is in an off state, the inductor 14, the resistor 16, the capacitance Coff resulting from the jth FET $10_j$ in the off state constitute a parallel resonant circuit.

In the present embodiment, not all of the FETs may necessarily constitute a parallel resonant circuit. In the example illustrated in FIG. 4, only one of the multiple FETs can constitute a parallel resonant circuit. Accordingly, the obtainable advantages are limited. The configuration illustrated in FIG. 4 is a simple example provided to describe the principles. One way to seek more advantages can be an arrangement in which a combination of the inductor 14 and the resistor 16 being electrically connected in series to each other is connected in parallel to each of a maximum number of FETs of the N FETs.

As described above, in the present embodiment, the parallel resonant circuit is configured in the jth FET $10_j$ electrically connected in parallel to a combination in which the inductor 14 and the resistor 16 are electrically connected in series to each other. Thus, the switching circuit less affected by the resonant frequency and capable of suppressing the variations in the isolation characteristics can be achieved.

Third Embodiment

Configuration

A switching circuit according to a third embodiment based on the present invention is described with reference to FIG. 5. A switching circuit 503 according to the present embodiment has the same fundamental configuration as the switching circuit described in the first embodiment, which is described as an example where N is two. In the first embodiment, a combination in which the inductor 14 as the inductor component and the resistor 16 as the resistor component are electrically connected in series to each other is electrically connected in parallel to only the first FET 11. In contrast, in the present embodiment, as illustrated in FIG. 5, such a combination is also electrically connected in parallel to the second FET 12.

Actions and Advantages

Figure 5:
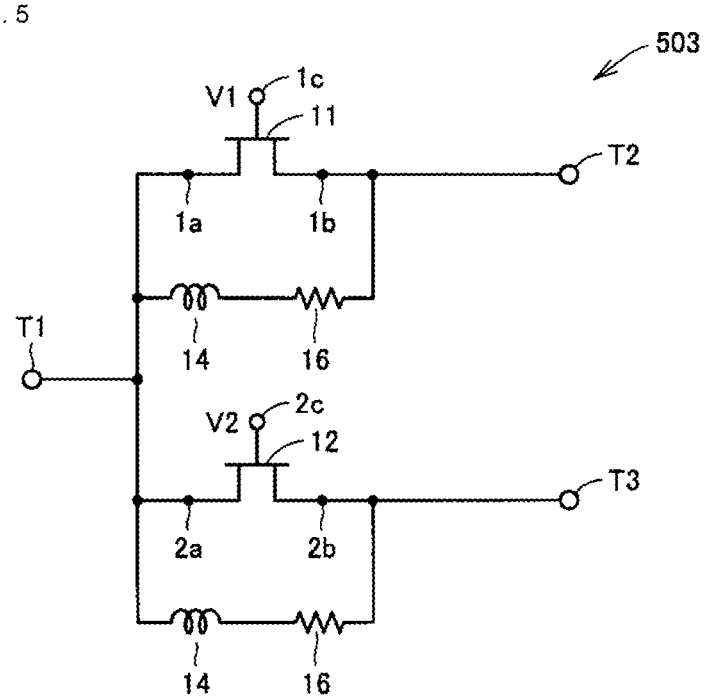
FIG. 5 is a circuit diagram that illustrates a basic configuration of a switching circuit according to a third embodiment based on the present invention.

The switching circuit 503 illustrated in FIG. 5 can function as an SPDT switch, as in the switching circuit 501 illustrated in the first embodiment. In this case, the first FET 11 and the second FET 12 are turned on and off in a complementary manner.

When the first FET 11 is in an on state and the second FET 12 is in an off state, a first transmission path is established between the first input/output terminal T1 and the second input/output terminal T2. In contrast, when the first FET 11 is in an off state and the second FET 12 is in an on state, a second transmission path is established between the first input/output terminal T1 and the third input/output terminal T3.

Figure 6:
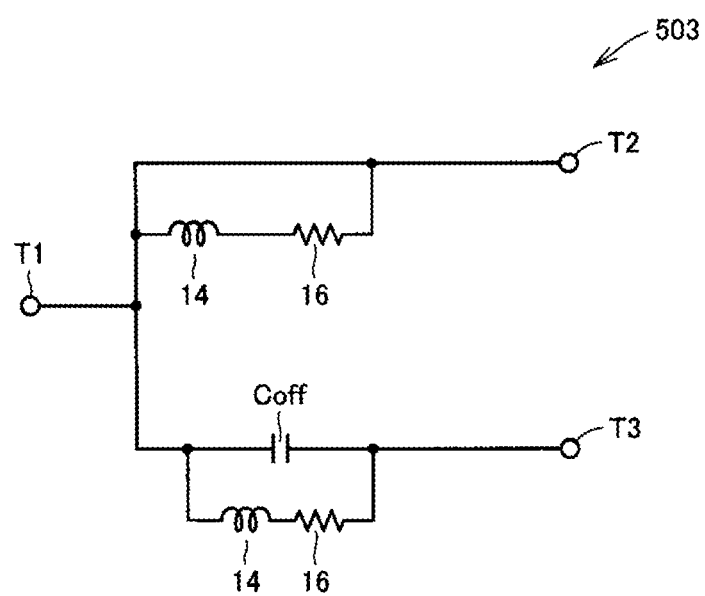
FIG. 6 is an equivalent circuit diagram in a state where a first transmission path is established in the switching circuit according to the third embodiment based on the present invention.

An equivalent circuit diagram for the switching circuit 503 when the first transmission path is established is illustrated in FIG. 6. The second transmission path is disconnected by the second FET 12, and the second FET 12 can be considered the capacitance Coff. Accordingly, the inductor 14, the resistor 16, and the capacitance Coff electrically connected to the second FET 12 constitute a parallel resonant circuit. Because the first transmission path is established, no current flows through the inductor 14 and the resistor 16 electrically connected to the first FET 11, and the presence of the inductor 14 and the resistor 16 electrically connected to the first FET 11 is negligible. In this case, at the resonant frequency of the parallel resonant circuit, the isolation between the first input/output terminal T1 and the third input/output terminal T3 can be increased.

Figure 7:
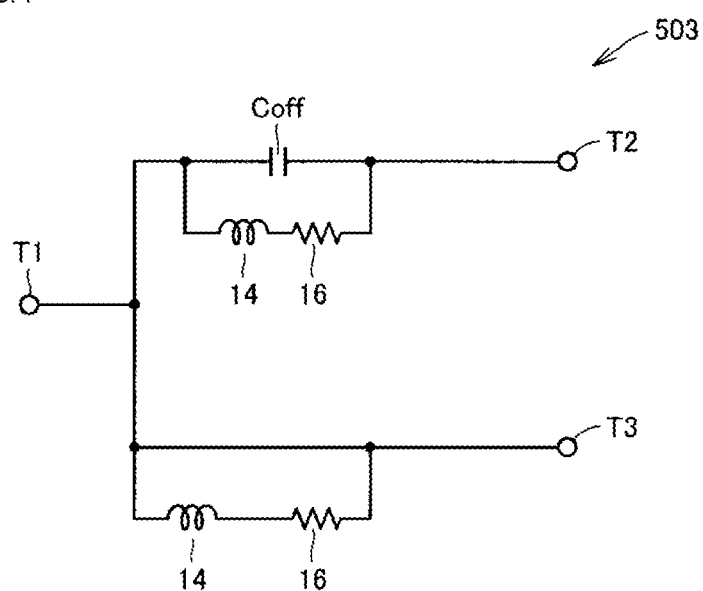
FIG. 7 is an equivalent circuit diagram in a state where a second transmission path is established in the switching circuit according to the third embodiment based on the present invention.

An equivalent circuit diagram for the switching circuit 503 when the second transmission path is established is illustrated in FIG. 7. The first transmission path is disconnected by the first FET 11, and the first FET 11 can be considered the capacitance Coff. Accordingly, the inductor 14, the resistor 16, and the capacitance Coff electrically connected to the first FET 11 constitute a parallel resonant circuit. Because the second transmission path is established, no current flows through the inductor 14 and the resistor 16 electrically connected to the second FET 12, and the presence of the inductor 14 and the resistor 16 electrically connected to the second FET 12 is negligible. In this case, at the resonant frequency of the parallel resonant circuit, the isolation between the first input/output terminal T1 and the second input/output terminal T2 can be increased.

In both of the first transmission path and the second transmission path, because the resistor 16 electrically connected in series is included in the parallel resonant circuit, the Q value of the parallel resonant circuit is reduced, whereas the half-width can be widened. As a result, the isolation deviation can be reduced over a wide frequency band, as described in the first embodiment.

Accordingly, in the present embodiment, the switching circuit less affected by the resonant frequency and capable of suppressing the variations in the isolation characteristics can be achieved.

Fourth Embodiment

Configuration

Figure 8:
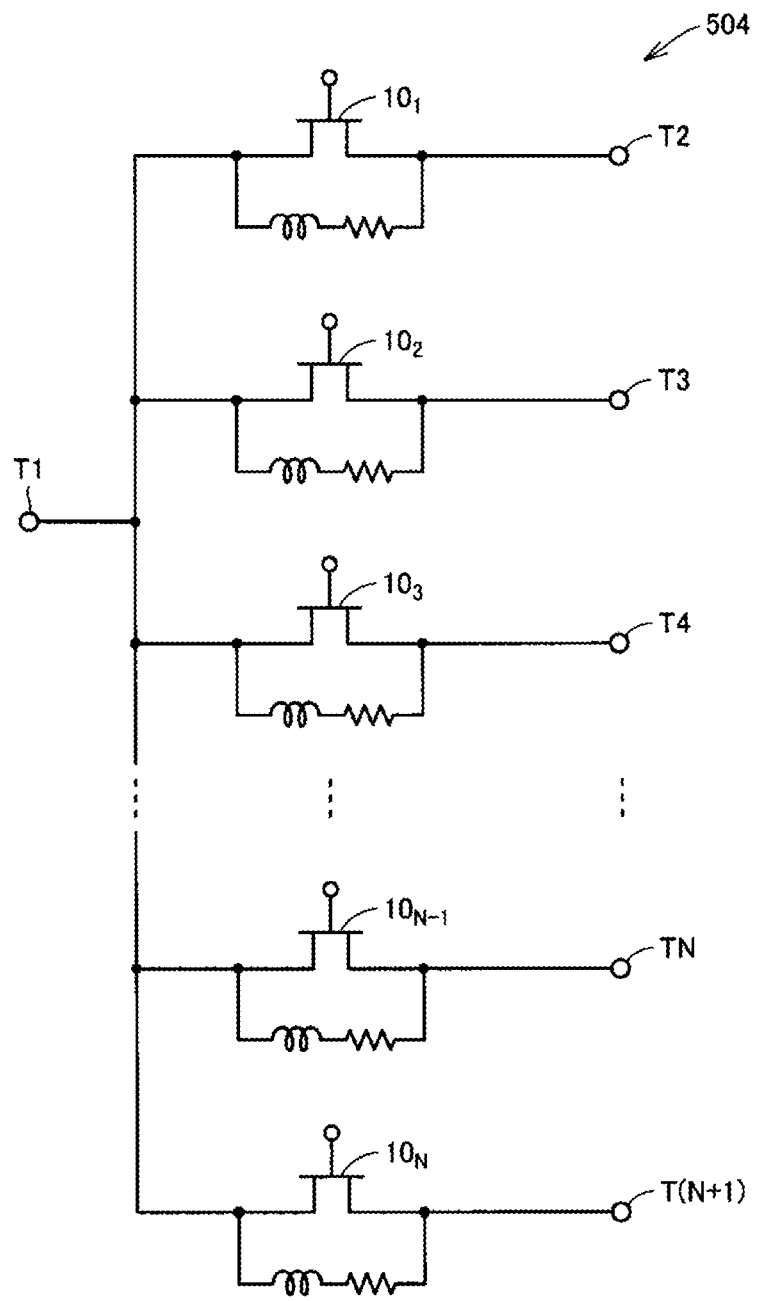
FIG. 8 is a circuit diagram that illustrates a basic configuration of a switching circuit according to a fourth embodiment based on the present invention.

A switching circuit according to a fourth embodiment based on the present invention is described with reference to FIG. 8. In the third embodiment, an example where N is two is described. In the present embodiment, as illustrated in FIG. 8, a generalized configuration is described. For the sake of description, N is indicated as a large integer in FIG. 8. However, according to the idea in the present invention, N may be any integer of more than one. The present embodiment has the same fundamental configuration as in the second embodiment, but differs from the second embodiment in the respects described below.

In the present embodiment, as illustrated in FIG. 8, for each integer k of one to N, a combination in which an inductor component and a resistor component are electrically connected in series to each other is disposed between the first end and the second end of the kth FET such that the combination is electrically connected in parallel to the kth FET. In other words, the combination in which the inductor component and the resistor component are electrically connected in series to each other is electrically connected in parallel to each of all of the first FET $10_1$ to Nth FET $10_N$.

The inductance value of the inductor component and the resistance value of the resistor component included in the circuit connected in parallel to each FET may not necessarily be the same in all of the first FET $10_1$ to Nth FET $10_N$.

Actions and Advantages

A switching circuit 504 according to the present embodiment can function as an SPNT switch. In particular, in the present embodiment, because the number of input/output terminals can be large, the switching circuit is suited for use in switching a frequency band where a signal is transmitted by selecting one from among a plurality of frequency bands.

In the present embodiment, by turning on only one FET selected from among N FETs and turning off the others, one transmission path selected from among N transmission paths is established. At this time, the FETs corresponding to all the other transmission paths are disconnected and thus can be considered capacitance. Each of the FETs being in a disconnected state and the inductor and resistor electrically connected in parallel to the FET constitute a parallel resonant circuit. Accordingly, the isolation other than that for one established transmission path can be increased.

Thus in the present embodiment, the switching circuit less affected by the resonant frequency and capable of suppressing the variations in the isolation characteristics can be achieved.

Fifth Embodiment

Configuration

In the switching circuit 501 (see FIG. 1) described in the first embodiment, each of the first FET 11 and the second FET 12 consists of a single FET. However, the switching circuit based on the present invention is not limited to that configuration. For example, as described below, at least one of the first FET 11 and the second FET 12 may include a plurality of FET elements connected in a multistage manner. Each of the plurality of FET elements includes an individual gate end, a source end, and a drain end.

The "plurality of FET elements connected in a multistage manner" means a plurality of FET elements electrically connected in series to each other. In the switching circuit, a combination in which the plurality of FET elements are electrically connected in series to each other is arranged in place of the single FET. In addition, each of the FET elements is configured to receive a common control voltage at its gate end. The use of the plurality of FET elements connected in a multistage manner in place of the single FET can improve the electric power handling capability of the switching circuit. The number of FET elements included in the "plurality of FET elements connected in a multistage manner" may be any number of more than one.

Figure 9:
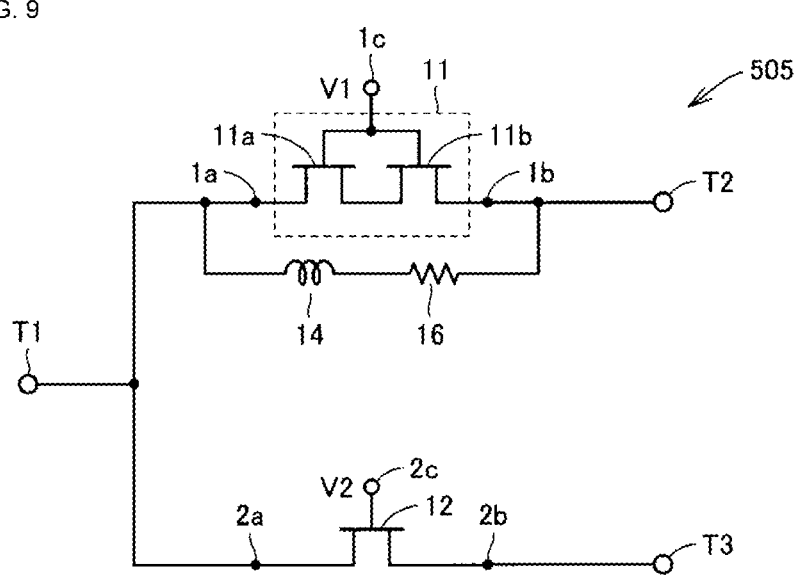
FIG. 9 is a circuit diagram that illustrates a basic configuration of a switching circuit according to a fifth embodiment based on the present invention.

The switching circuit according to the fifth embodiment based on the present invention is described with reference to FIG. 9.

A switching circuit 505 according to the present embodiment has the same fundamental configuration as in the switching circuit 501 described in the first embodiment, but differs therefrom in the respects described below. In the switching circuit 505, for at least one integer m of one to N, the mth FET includes a plurality of FET elements that are electrically connected in series to each other and that are disposed between the first end and the second end. Each of the plurality of FET elements includes an individual gate end. A common bias voltage is supplied from the gate end of the mth FET to the individual gate end of each of the plurality of FET elements. In the example illustrated in FIG. 9, N is two, and "at least one integer m of one to N" is one. That is, the first FET 11 includes a plurality of FET elements 11a and 11b electrically connected in series to each other disposed between the first end 1a and the second end 1b. Each of the FET elements 11a and 11b includes an individual gate end. A common bias voltage V1 is supplied from the gate end 1c of the first FET 11 to the individual gate end of each of the plurality of FET elements 11a and 11b.

Actions and Advantages

According to the present embodiment, because the first FET includes the plurality of FET elements connected in a multistage manner, the electric power handling capability of the switching circuit can be improved.

Sixth Embodiment

Configuration

Figure 10:
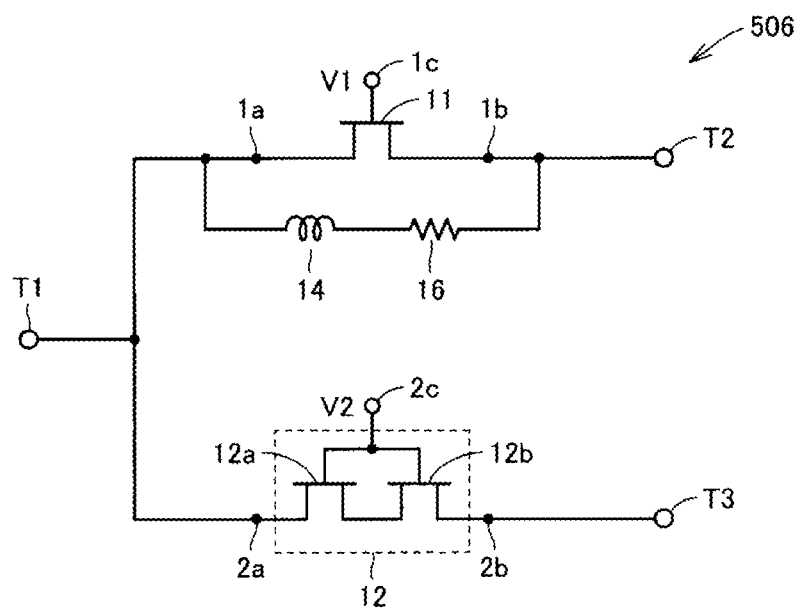
FIG. 10 is a circuit diagram that illustrates a basic configuration of a switching circuit according to a sixth embodiment based on the present invention.

A switching circuit according to a sixth embodiment based on the present invention is described with reference to FIG. 10.

A switching circuit 506 according to the present embodiment based on the present invention has the same fundamental configuration as in the switching circuit 505 described in the fifth embodiment, but differs therefrom in the respects described below. In the example illustrated in FIG. 10, N is two, and "at least one integer m of one to N" is not one but two. That is, the first FET 11 consists of a single FET. Instead, the second FET 12 includes a plurality of FET elements 12a and 12b electrically connected in series to each other disposed between the first end 2a and the second end 2b. Each of the FET elements 12a and 12b includes an individual gate end. A common bias voltage V2 is supplied from the gate end 2c of the second FET 12 to the individual gate end of each of the plurality of FET elements 12a and 12b.

Actions and Advantages

According to the present embodiment, because the second FET includes the plurality of FET elements connected in a multistage manner, the electric power handling capability of the switching circuit can be improved.

Seventh Embodiment

Configuration

Figure 11:
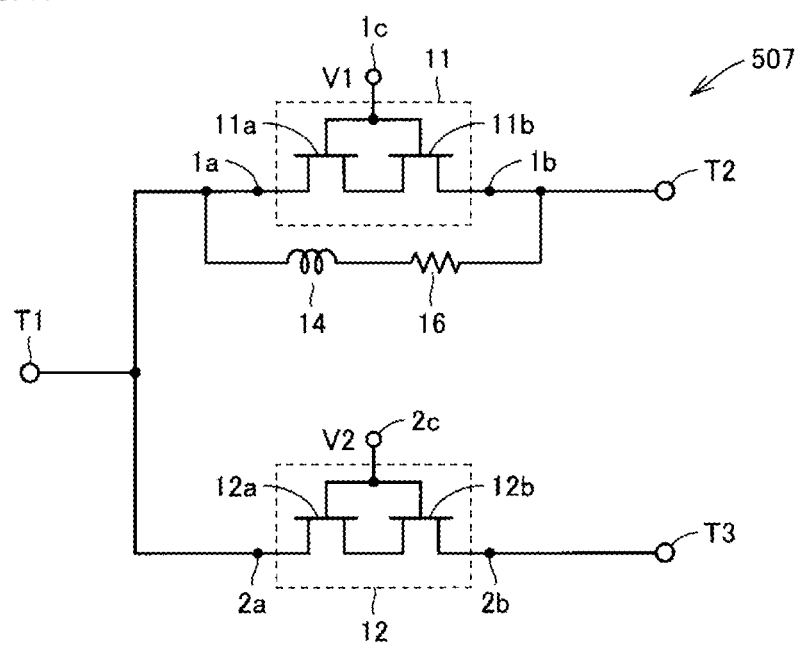
FIG. 11 is a circuit diagram that illustrates a basic configuration of a switching circuit according to a seventh embodiment based on the present invention.

A switching circuit according to a seventh embodiment based on the present invention is described with reference to FIG. 11.

A switching circuit 507 according to the present embodiment based on the present invention has the same fundamental configuration as in the switching circuit 501 described in the first embodiment, but differs therefrom in the respects described below. In the example illustrated in FIG. 11, N is two, and "at least one integer m of one to N" is one and two. That is, the first FET 11 includes the plurality of FET elements 11a and 11b electrically connected in series to each other disposed between the first end 1a and the second end 1b. Each of the FET elements 11a and 11b includes the individual gate end. The common bias voltage V1 is supplied from the gate end 1c of the first FET 11 to the individual gate end of each of the plurality of FET elements 11a and 11b. In addition, the second FET 12 includes the plurality of FET elements 12a and 12b electrically connected in series to each other disposed between the first end 2a and the second end 2b. Each of the FET elements 12a and 12b includes the individual gate end. The common bias voltage V2 is supplied from the gate end 2c of the second FET 12 to the individual gate end of each of the plurality of FET elements 12a and 12b.

Actions and Advantages

According to the present embodiment, because each of the first FET and the second FET includes the plurality of FET elements connected in a multistage manner, the electric power handling capability of the switching circuit can be improved.

In the fifth to seventh embodiments, a combination in which an inductor component and a resistor component are electrically connected in series to each other collectively extends over all of the plurality of FET elements connected in a multistage manner such that the combination is electrically connected in parallel to them. However, a connecting method is not limited to the above-described configuration. For example, the combination in which the inductor component and the resistor component are electrically connected in series to each other may extend over only a part of the plurality of FET elements connected in a multistage manner such that the combination is electrically connected in parallel to it. As another example, the combination in which the inductor component and the resistor component are electrically connected in series to each other may individually extend over each of the plurality of FET elements connected in a multistage manner such that the combination is electrically connected in parallel to it. However, it may be preferable that the combination in which the inductor component and the resistor component are electrically connected in series to each other collectively extend over all of the plurality of FET elements connected in a multistage manner such that the combination is electrically connected in parallel to them, as illustrated in the fifth to seventh embodiments.

Eighth Embodiment

Configuration

A semiconductor module according to an eighth embodiment based on the present invention is described with reference to FIG. 12. The semiconductor module according to the present embodiment is the one in which all the constituent components in the switching circuit described in one of the embodiments described above are disposed on a single semiconductor substrate. In a semiconductor module 601 illustrated in FIG. 12, all the constituent components in the switching circuit 501 are disposed on a single semiconductor substrate 8. The first FET 11 and the second FET 12 are disposed in a transistor region 5 on the surface of the semiconductor substrate 8. The inductor 14 is disposed in another region on the surface of the semiconductor substrate 8. The first input/output terminal T1, the second input/output terminal T2, and the third input/output terminal T3 are disposed in still another region on the surface of the semiconductor substrate 8 using pads.

Here, the example of the switching circuit 501, in which N is two, is illustrated. Similarly, in the cases where N is three or more, all of the constituent components may be disposed on the single semiconductor substrate.

Actions and Advantages

According to the semiconductor module in the present embodiment, because all the constituent components in the switching circuit are disposed on the single semiconductor substrate, an unnecessary parasitic component that would occur when the constituent components are connected using individual wiring can be avoided.

The inductor component included in the switching circuit may preferably be a spiral inductor disposed on the semiconductor substrate. FIG. 12 illustrates such a configuration example. That is, the inductor 14 is a spiral inductor formed by arranging a lead (line) on the surface of the semiconductor substrate 8 in a spiral manner. In general, the spiral inductor tends to have a smaller parasitic capacitance, in comparison with a helical structure of a chip inductor. Accordingly, the use of the spiral inductor disposed on the semiconductor substrate as the above-described inductor component is advantageous in terms of reducing the parasitic component. Integrating the first to Nth FETs and their associated inductors on the semiconductor substrate 8 can lead to miniaturization of the switching circuit.

An example of the semiconductor substrate 8 may be a compound semiconductor substrate. Examples of the compound semiconductor substrate here may include a gallium arsenide (GaAs) substrate and a silicon-germanium (SiGe) substrate. Another example of the semiconductor substrate 8 may be a silicon (Si) substrate.

Figure 12:
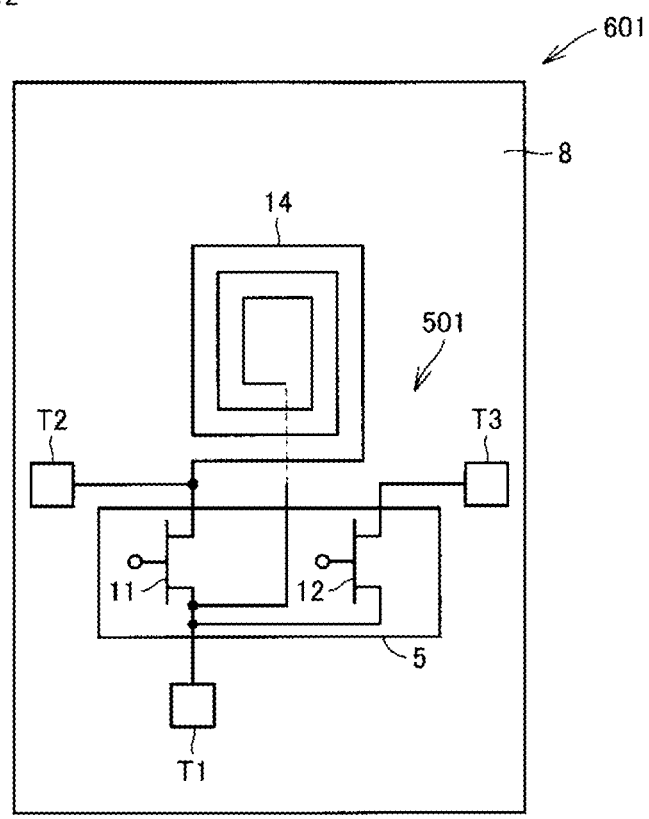
FIG. 12 is a schematic plan view of a semiconductor module according to an eighth embodiment based on the present invention.

FIG. 12 illustrates the constituent components in the switching circuit in a schematic manner for the sake of description. Accordingly, the real arrangement of the constituent components in the switching circuit is not limited to the one illustrated in FIG. 12.

It is preferable to provide a configuration that the above-described inductor component is derived from the spiral inductor disposed on the above-described semiconductor substrate and the above-described resistor component is derived from a line resistor in the spiral inductor. This configuration eliminates the necessity of arranging a resistor independent of the inductor, and thus the layout can be made compact. As a result, the switching circuit can be miniaturized.

Figure 13:
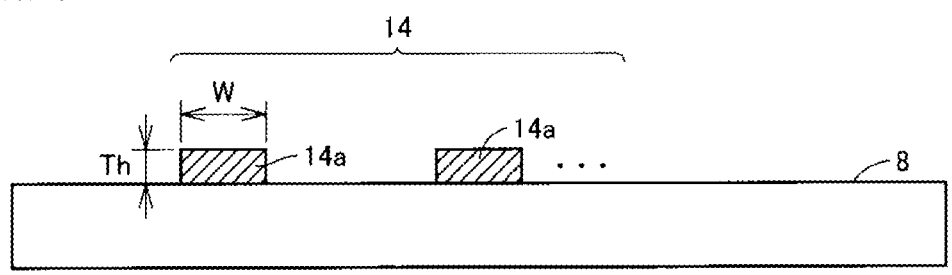
FIG. 13 is an illustration for describing dimensions of a line in an inductor illustrated in FIG. 12.

FIG. 13 is an illustration for describing the dimensions of a line in the inductor 14 illustrated in FIG. 12. The inductor 14 is a spiral inductor, as previously described, and includes lines 14a made of a conductive material (e.g., gold (Au)). When attention is drawn to a cross-sectional shape of a single one of the line 14a, the line 14a has a line width W and a line thickness Th. The line width W of the spiral inductor may preferably be approximately 5 µm or less. When the line width W is approximately 5 µm or less, the inductor 14 can be miniaturized. The line thickness Th may preferably be approximately 2 µm or less. The use of this configuration enables the spiral inductor to include a line resistor sufficient to serve as the resistor component. A band pass filter having good attenuation characteristics on the high-frequency band side can also be achieved.

Moreover, when the line thickness Th is approximately 2 µm or less, a parasitic capacitance caused by a state in which the neighboring lines 14a face each other in the spiral inductor as the inductor 14 can be reduced. This is because the area of the portion where the neighboring lines 14a face each other can decrease with a reduction in the line thickness Th. Accordingly, capacitive coupling occurring in the winding of the spiral inductor can be reduced by a reduction in the line thickness Th.

Figure 14:
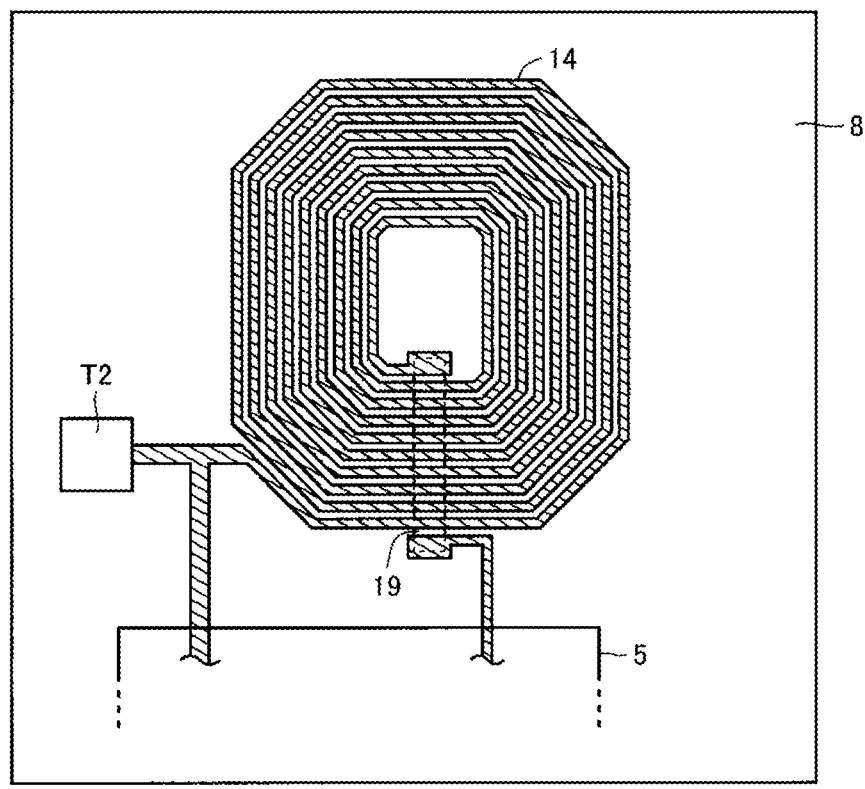
FIG. 14 is a schematic plan view of a first example inductor being a spiral inductor and its surroundings.

A first example of the inductor 14 being the spiral inductor is illustrated in FIG. 14. In this example, a jumper 19 is arranged to connect an inner end portion of the inductor 14 to, for example, the first end of the first FET. An outer end portion of the inductor 14 is connected to, for example, the second end of the first FET and at the same time to the second input/output terminal T2. With this configuration, the resistor 16 can be achieved by the resistor component in the inductor 14. Accordingly, the two-dimensional layout can be made compact, and thus the size of the switching circuit can be reduced.

Figure 15:
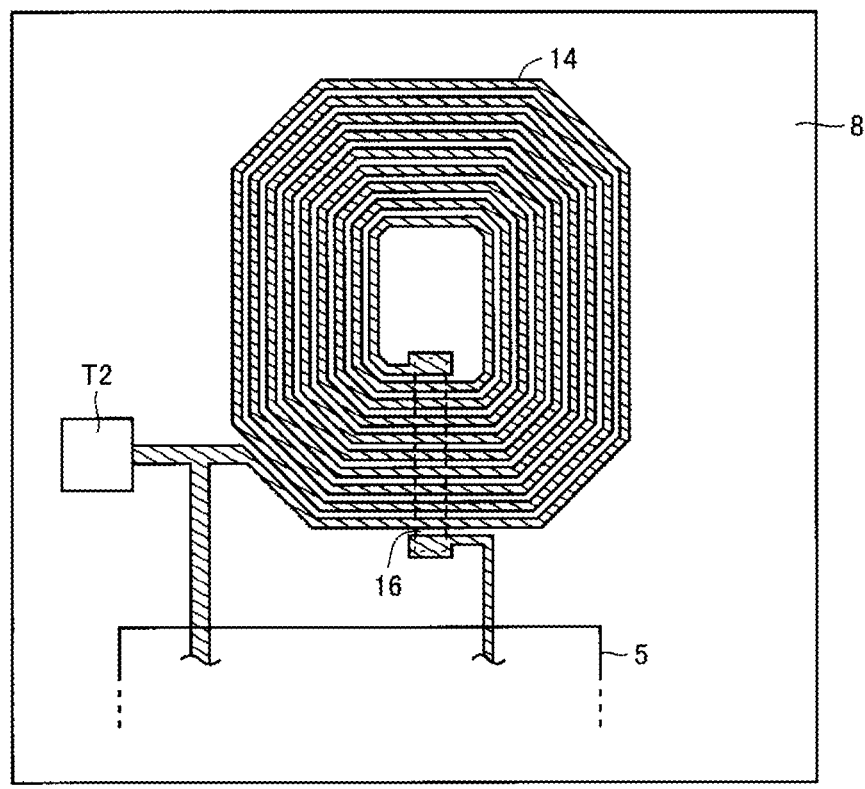
FIG. 15 is a schematic plan view of a second example inductor being a spiral inductor and its surroundings.

A second example of the inductor 14 being the spiral inductor is illustrated in FIG. 15. In this example, to obtain a desired resistance value, a necessary resistor component is achieved by the resistor component originally included in the inductor 14 and, in addition to that, the resistor 16 electrically connected to the inductor 14. The resistor 16 may be disposed inside the semiconductor substrate 8 or may be disposed on the surface of the semiconductor substrate 8, for example.

Ninth Embodiment

High-Frequency Module

Figure 16:
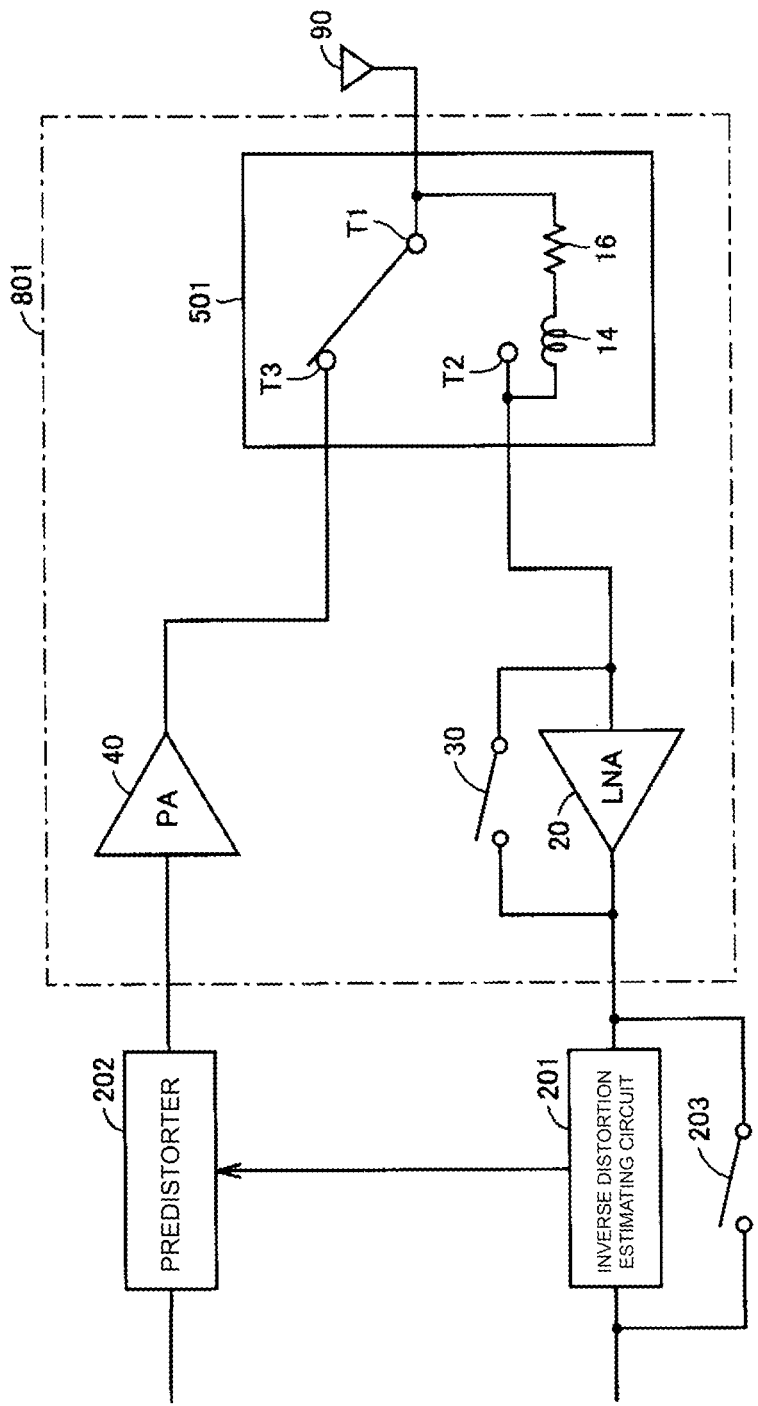
FIG. 16 illustrates one example configuration of a high-frequency module according to a ninth embodiment based on the present invention.

A high-frequency module according to a ninth embodiment based on the present invention is described with reference to FIG. 16. A high-frequency module 801 is achieved as a front-end circuit for wireless communications. As illustrated in FIG. 16, the high-frequency module 801 has a configuration conforming the technique called digital predistortion (hereinafter also referred to also as "DPD").

The high-frequency module 801 includes the switching circuit 501 described in the first embodiment.

Specifically, as illustrated in FIG. 16, the high-frequency module 801 includes the switching circuit 501, a low noise amplifier (hereinafter referred to as "LNA") 20, a switching element 30, and a power amplifier (hereinafter referred to as "PA") 40. The first input/output terminal T1 of the switching circuit 501 is connected to an antenna 90. The second input/output terminal T2 of the switching circuit 501 is connected to an input end of the LNA 20. The third input/output terminal T3 of the switching circuit 501 is connected to an output end of the PA 40.

The switching element 30 switches whether the input end of the LNA 20 is short-circuited to the output end of the LNA 20. In other words, the switching element 30 establishes a path used when a signal from the second input/output terminal T2 bypasses the LNA 20.

In addition to the switching circuit 501, the LNA 20, the switching element 30, and the PA 40 may be integrated on the same semiconductor substrate. The high-frequency module 801 may be achieved by using a plurality of semiconductor chips. The switching circuit 501 and the LNA 20 may be integrated. With this configuration, a parasitic component (capacitance component or resistor component) occurring in the connection portion of the switching circuit 501 and the LNA 20 can be reduced. Accordingly, the loss can be reduced.

The switching circuit 501 and the PA 40 may be integrated. With this configuration, a parasitic component (capacitance component or resistor component) occurring in the connection portion of the switching circuit 501 and the PA 40 can be reduced. Accordingly, the loss can be reduced.

The output end of the LNA 20 is connected to an inverse distortion estimating circuit 201. The input end of the PA 40 is connected to a predistorter 202.

Figure 17:
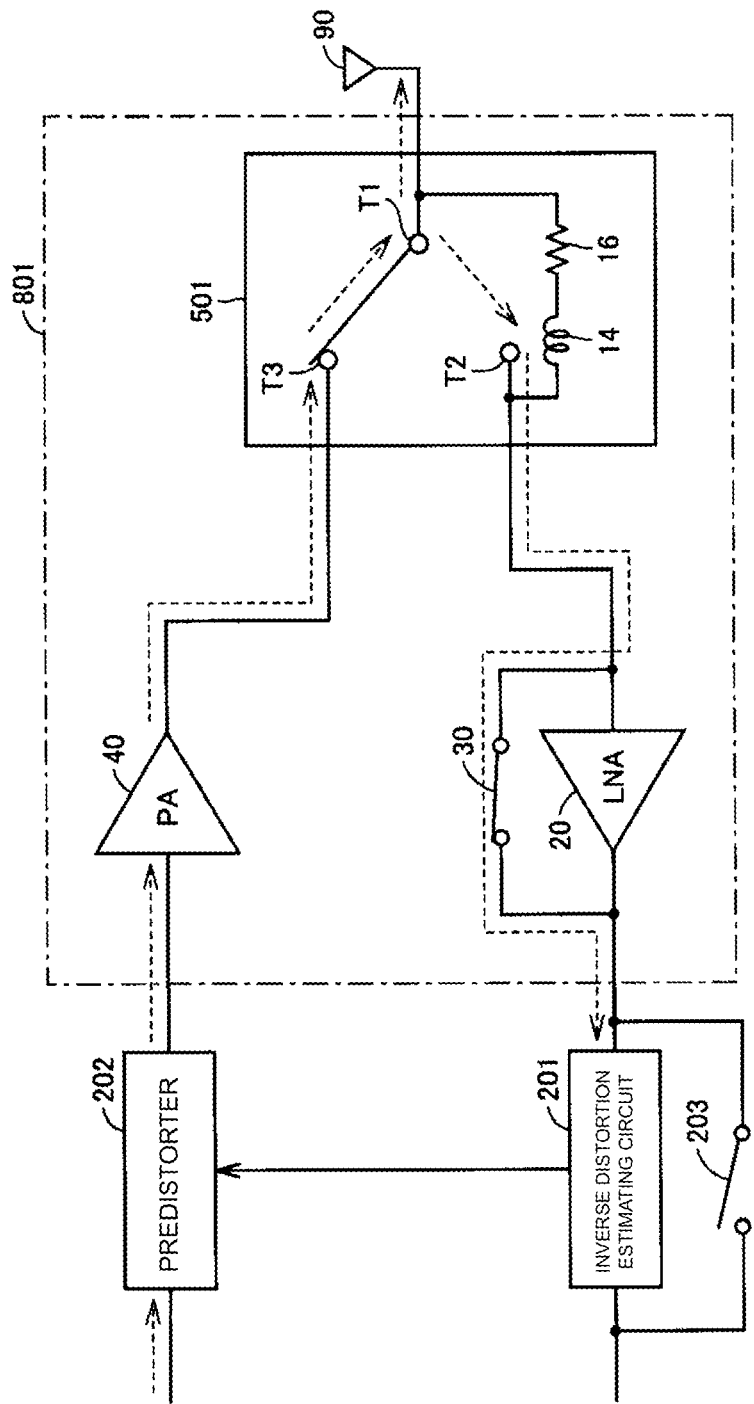
FIG. 17 is an illustration for describing an operation in transmitting a signal from the high-frequency module illustrated in FIG. 16.

An operation in transmitting a signal from the high-frequency module 801 illustrated in FIG. 16 is described with reference to FIG. 17. To transmit a signal, as illustrated in FIG. 17, the switching circuit 501 operates such that the transmission path between the first input/output terminal T1 and the third input/output terminal T3 is established. This transmission path corresponds to the second transmission path in the first embodiment. The transmission path between the first input/output terminal T1 and the second input/output terminal T2 corresponds to the first transmission path.

The PA 40 amplifies an input signal and outputs the amplified signal. The signal output from the PA 40 is transmitted from the third input/output terminal T3 of the switching circuit 501 to the first input/output terminal T1 of the switching circuit 501 through the second transmission path. The antenna 90 outputs a signal transmitted to the first input/output terminal T1 of the switching circuit 501 in the form of a radio wave.

Typically, a power amplifier is required to have high power efficiency and high linearity. There is a trade-off relationship between the power efficiency and the linearity of the power amplifier. Accordingly, if a signal is amplified using a power amplifier having low linearity to achieve power savings, nonlinear distortion of the power amplifier may reduce the communication quality or cause interference on other communication systems.

One technique for enhancing efficiency to solve such a problem is DPD, which is previously described. Because there is a limit to the isolation of the switching circuit 501, as illustrated in FIG. 17, a part of the signals transmitted from the PA 40 to the switching circuit 501 leaks to the first transmission path. That is, a part of the signals leaks to the side of the second input/output terminal T2. The leaked signal is used as a feed-back signal for estimating the inverse distortion.

Because the switching element 30 is in an on state, the signal leaked to the first transmission path bypasses the LNA 20. Because a bypass switch 203 is in an off state, the signal having bypassed the LNA 20 is input into the inverse distortion estimating circuit 201. The inverse distortion estimating circuit 201 generates a signal distorted in a direction opposite to the distortion in the input signal. The predistorter 202 combines the original input signal and the signal generated by the inverse distortion estimating circuit 201 and outputs the combined signal to the PA 40. By the use of DPD, a transmission signal having a reduced distortion is obtainable while an increase in power consumption is suppressed.

To implement DPD, the leakage of a signal having an appropriate magnitude to the first transmission path in the switching circuit 501 is needed. In other words, it is necessary for the switching circuit 501 to have appropriate isolation characteristics. For example, when the switching circuit has the isolation characteristics indicated by the curve A2 illustrated in FIG. 3, the isolation deviation within a frequency band (e.g., approximately 5 GHz to approximately 6 GHz) is large. Accordingly, when the frequency of a signal output from the power amplifier varies, the magnitude of a signal leaked to the first transmission path may largely vary.

In contrast, in the switching circuit 501 according to the first embodiment of the present invention, the isolation deviation can be reduced over a wide frequency band, as indicated by the curve A1 illustrated in FIG. 3. Thus, the strength of a leaked signal input to the inverse distortion estimating circuit 201 can be stabilized over the wide frequency band. The stabilization of the strength of the signal input to the inverse distortion estimating circuit 201 over the wide frequency band is advantageous for estimating the inverse distortion.

Because the high-frequency module according to the present embodiment includes the switching circuit 501 according to the first embodiment, the use of this high-frequency module can provide a satisfactory high-frequency circuit.

Figure 18:
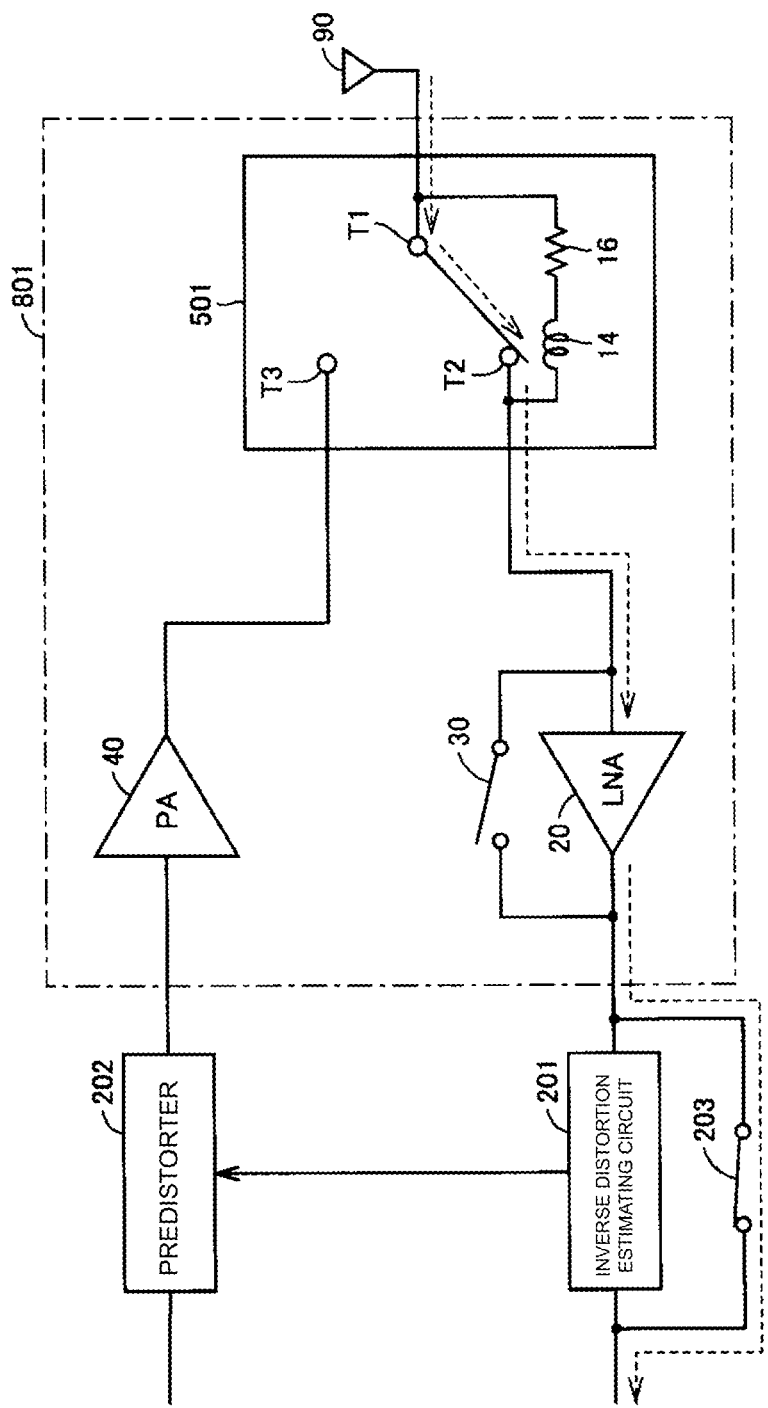
FIG. 18 is an illustration for describing an operation in receiving a signal by the high-frequency module illustrated in FIG. 16.

A receiving operation in the high-frequency module 801 is described with reference to FIG. 18. To receive a signal, as illustrated in FIG. 18, the switching circuit 501 is switched such that the first transmission path is established between the first input/output terminal T1 and the second input/output terminal T2. When the antenna 90 receives a signal, the signal is sent from the first input/output terminal T1 to the second input/output terminal T2 through the first transmission path.

When the strength of the signal received by the antenna 90 is low, as illustrated in FIG. 18, the received signal is amplified by the LNA 20. At this time, the switching element 30 is in an off state. When the strength of the signal received by the antenna 90 is high, the LNA 20 is turned off and the switching element 30 is turned on. Accordingly, the signal bypasses the LNA 20. In receiving a signal by the high-frequency module 801, the bypass switch 203 is turned on. Thus, the signal received by the high-frequency module 801 bypasses the inverse distortion estimating circuit 201 and does not pass through the inverse distortion estimating circuit 201.

Figure 19:
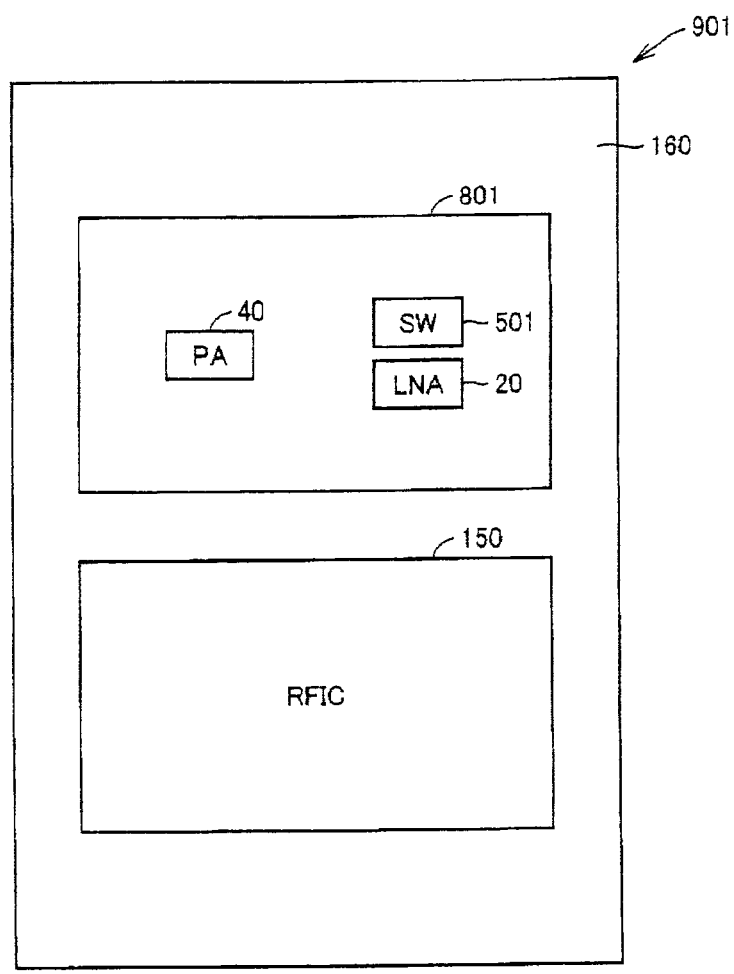
FIG. 19 is a schematic diagram of a high-frequency circuit including the high-frequency module illustrated in FIG. 16.

FIG. 19 is a schematic diagram that illustrates a configuration of a high-frequency circuit 901 including the high-frequency module 801 illustrated in FIG. 16. As illustrated in FIG. 19, the high-frequency circuit 901 includes the high-frequency module 801, a radio frequency integrated circuit (RFIC) 150, and a substrate 160. The high-frequency module 801 and the RFIC 150 are mounted on the substrate 160.

The high-frequency module 801 includes the switching circuit (SW) 501, the LNA 20, the switching element 30 (not illustrated in FIG. 19), and the PA 40. The RFIC 150 controls the high-frequency module 801. The RFIC 150 may include the inverse distortion estimating circuit 201 and the predistorter 202. With this configuration, the high-frequency circuit suited for DPD can be provided.

The disclosed embodiments are to be considered in all respects as illustrative and not restrictive. The scope of the invention is indicated by the appended claims rather than by the foregoing description; and all changes which come within the meaning and range of the equivalency of the claims are intended to be embraced therein.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A semiconductor module comprising:
    a switching circuit comprising:
        for an integer N of two or more,
        first to (N+1)th input/output terminals; and
        first to Nth field-effect transistors each including a gate end, a source end, and a drain end,
    wherein:
        one of the source end and the drain end is referred to as a first end and another one is referred to as a second end,
        the first input/output terminal is electrically connected to the first ends of all of the first to Nth field-effect transistors,
        for each integer i of one to N, the second end of the ith field-effect transistor is directly connected to the (i+1)th input/output terminal,
        for at least one integer j of one to N, a combination in which an inductor component and a resistor component are electrically connected in series to each other is disposed between the first end and the second end of the jth field-effect transistor such that the combination is electrically connected in parallel to the jth field-effect transistor,
        at least one of the field-effect transistors is not connected in parallel to any combination of the inductor component and the resistor component that are electrically connected in series to each other, and to any combination of another inductor component and another resistor component that are electrically connected in series to each other,
        the inductor component results from a spiral inductor disposed on a semiconductor substrate on which all constituent components of the switching circuit are disposed, and
        the resistor component results from a line resistor in the spiral inductor, and the semiconductor substrate.

2. The semiconductor module according to claim 1, wherein for each integer k of one to N,
    a combination in which an inductor component and a resistor component are electrically connected in series to each other is disposed between the first end and the second end of the kth field-effect transistor such that the combination is electrically connected in parallel to the kth field-effect transistor.

3. The semiconductor module according to claim 1, wherein for at least one integer m of one to N,
the mth field-effect transistor includes a plurality of field-effect transistor elements each including an individual gate end, the plurality of field-effect transistor elements are disposed between the first end and the second end and electrically connected in series to each other, and
a common bias voltage is supplied from the gate end of the mth field-effect transistor to the individual gate end of each of the plurality of field-effect transistor elements.

4. The semiconductor module according to claim 1, wherein the spiral inductor has a line width of 5 μm or less.

5. The semiconductor module according to claim 1, wherein the spiral inductor has a line thickness of 2 μm or less.

6. The semiconductor module according to claim 2, wherein for at least one integer m of one to N,
the mth field-effect transistor includes a plurality of field-effect transistor elements each including an individual gate end, the plurality of field-effect transistor elements are disposed between the first end and the second end and electrically connected in series to each other, and
a common bias voltage is supplied from the gate end of the mth field-effect transistor to the individual gate end of each of the plurality of field-effect transistor elements.

7. The semiconductor module according to claim 1, wherein the spiral inductor has a line width of 5 μm or less.

8. The semiconductor module according to claim 1, wherein the spiral inductor has a line thickness of 2 μm or less.

9. The semiconductor module according to claim 4, wherein the spiral inductor has a line thickness of 2 μm or less.

10. The semiconductor module according to claim 1, wherein the resistor component is realized by a jumper that connects an inner end portion of the spiral inductor to the first end of the first input/output terminal, and an outer end portion of the spiral inductor is connected to the second end of a second input/output terminal and to a second end of a second field-effect transistor.

11. The semiconductor module according to claim 1, wherein the resistor component is electrically connected to the spiral inductor.

12. The semiconductor module according to claim 1, wherein the resistor component is disposed inside the semiconductor substrate.

13. The semiconductor module according to claim 1, wherein the resistor component is disposed on a surface of the semiconductor substrate.

14. The semiconductor module according to claim 1, wherein the field-effect transistors are disposed in a transistor region on a surface of the semiconductor substrate, the spiral inductor is disposed in another region on the surface of the semiconductor substrate, and the input/output terminals are disposed in yet another region on the surface of the semiconductor substrate using pads.

15. The semiconductor module according to claim 1, further comprising:
a low noise amplifier; and
a power amplifier, wherein:
the jth field-effect transistor which is connected to the combination in parallel is connected to an input end of the low noise amplifier via the second end, and
the at least one of the field-effect transistor which is not connected in parallel to the combination is connected to an output end of the power amplifier via the second end.

16. The semiconductor module according to claim 15, further comprising:
a switching element between the input end of the low noise amplifier and an output end of the low noise power amplifier, wherein:
when the switching element is closed, a portion of a signal from the second end of the at least one of the field-effect transistor which is not connected in parallel to the combination bypasses the low noise amplifier.

17. The semiconductor module according to claim 16, wherein the switching circuit, at least one of the low noise amplifier and the power amplifier, and the switching element are integrated on the same semiconductor substrate.

18. The semiconductor module according to claim 16, wherein when a transmission path between the first input/output terminal and the third input/output terminal is established, the switching element is in an ON state, and when the transmission path between the first input/output terminal and the second input/output terminal is established, the switching element is in an OFF state.

* * * * *